US010763696B2

(12) United States Patent
Locatelli et al.

(10) Patent No.: US 10,763,696 B2
(45) Date of Patent: Sep. 1, 2020

(54) COMPUTER-IMPLEMENTED METHOD FOR CONFIGURING AN ELECTRONIC RELAY

(71) Applicant: ABB S.p.A., Milan (IT)

(72) Inventors: Emilio Battista Locatelli, San Pellegrino Terme (IT); Simone Micheli, Zogno (IT)

(73) Assignee: ABB S.p.A., Milan (IT)

( * ) Notice: Subject to any disclaimer, the term of this patent is extended or adjusted under 35 U.S.C. 154(b) by 262 days.

(21) Appl. No.: 16/000,377

(22) Filed: Jun. 5, 2018

(65) Prior Publication Data
US 2018/0351400 A1    Dec. 6, 2018

(30) Foreign Application Priority Data

Jun. 5, 2017    (EP) .................................... 17174449

(51) Int. Cl.
*H02J 13/00* (2006.01)
*G01R 31/08* (2020.01)
(Continued)

(52) U.S. Cl.
CPC ........ *H02J 13/0062* (2013.01); *G01R 31/086* (2013.01); *H02H 3/006* (2013.01);
(Continued)

(58) Field of Classification Search
CPC ..................................................... H02J 13/00
See application file for complete search history.

(56) References Cited

FOREIGN PATENT DOCUMENTS

EP    1113556 A1    7/2001
WO    0120476 A1    3/2001
(Continued)

OTHER PUBLICATIONS

European Patent Office, Extended Search Report issued in corresponding Application No. 17174449.3, dated Dec. 8, 2017, 6 pp.

*Primary Examiner* — Tejal Gami
(74) *Attorney, Agent, or Firm* — Taft Stettinius & Hollister LLP; J. Bruce Schelkopf (57) ABSTRACT

A method for configuring an electronic relay including: providing a graphic user interface on a computer display, the graphic user interface including graphic resources activatable by a user; providing first graphic resources on the graphic user interface to assist a user in providing first configuration values to configure first operating parameters indicative of the operation of at least one of the first and second live electric circuits, the first operating parameters being processed by the electronic relay to provide synchro-reclosing functionalities; providing second graphic resources on the graphic user interface to assist a user in providing second configuration values to configure second operating parameters indicative of first operating conditions requested to the first and second live electric circuits to enable a re-connection between the first and second live electric circuits following a disconnection between the first and second live electric circuits, the second operating parameters being processed by the electronic relay to provide the synchro-reclosing functionalities; checking whether the electronic relay meets minimum operating requirements to operate; and if the electronic relay meets the minimum operating requirements, transmitting configuration information including at least the first and second configuration values to the electronic relay.

20 Claims, 9 Drawing Sheets

(51) Int. Cl.
    *H02H 3/06*         (2006.01)
    *H02H 3/00*         (2006.01)
    *G06Q 50/06*       (2012.01)

(52) U.S. Cl.
    CPC .............. *H02H 3/06* (2013.01); *H02H 3/063* (2013.01); *H02J 13/00018* (2020.01); *H02J 13/0075* (2013.01); *G06Q 50/06* (2013.01)

(56) References Cited

FOREIGN PATENT DOCUMENTS

| | | | |
|---|---|---|---|
| WO | 2010078132 | A2 | 7/2010 |
| WO | 2010078132 | A3 | 7/2010 |

COMPUTER-IMPLEMENTED METHOD FOR CONFIGURING AN ELECTRONIC RELAY

The present invention relates to the field of electric power distribution grids operating at low or medium voltage levels.

More particularly, the present invention relates to a computer-implemented method to configure an electronic relay capable of providing synchro-reclosing functionalities to enable a re-connection of a first live electric circuit (e.g. a micro-grid) with a corresponding second live electric circuit (e.g. a utility power grid) following a preceding disconnection between said electric circuits.

Electric power distribution grids comprise switching devices (e.g. circuit breakers, disconnectors, contactors, and the like) designed to enable specific sections of an electric power distribution grid to operate properly.

In many cases, a switching device is operatively associated with an electronic protection and control device (here referred to as "electronic relay") adapted to control said switching device in such a way to provide protection functionalities for some portions of an electric power distribution grid.

Among others, electronic relays capable of providing synchro-reclosing functionalities are notorious in the state of the art.

As is known, an electronic relay of this type is operatively associated to a switching device, capable of electrically connecting or disconnecting live electric circuits one from another at a given coupling node, and is adapted to check ("synchro-reclosing functionalities") whether the operating conditions of said live electric circuits, following their disconnection by the switching device, are compatible for a re-connection.

By properly checking suitable electric quantities provided by said live electric circuits at said coupling node when they are disconnected, an electronic relay capable of providing said synchro-reclosing functionalities ensures that the live electric circuits operate within a safe and stable compatibility area before the switching device is enabled to re-connect them.

In this way, possible dangerous fault events in said electric circuits upon their re-connection are efficiently prevented.

Examples of relays capable of providing synchro-reclosing functionalities are the relays commercialised under the brand name SPAU140C™ by ABB® Ltd. and the relays commercialised under the brand name SIPROTEC7VK61™ by SIEMENS® AG.

As for other electronic relays, an electronic relay of the above-mentioned type needs to process a set of operating parameters (hereinafter referred to as "operating parameters") to carry out its functionalities, in particular the above-mentioned synchro-reclosing functionalities.

Such operating parameters need to be properly set-up (or "configured" according to a widely used terminology) during the operating life of the relay, e.g. when this latter is installed on the field or during maintenance interventions.

Traditional solutions for configuring the operating parameters of an electronic relay of this type normally require a time-consuming cabling activity to acquire the inputs and outputs of the relay and an intensive programming activity to model and set-up the functionalities thereof.

All these activities normally entail the intervention of specialized personnel with a remarkable increase of the overall costs.

The main aim of the present invention is to provide a method for setting-up the operating parameters of an electronic relay capable of providing synchro-reclosing functionalities, which allows solving or mitigating the technical problems evidenced above.

Within this aim, an object of the present invention is to provide a method to carry out a quick and efficient configuration of the electronic relay.

A further object of the present invention is to provide a method that can be easily carried out even by non-specialized operators.

A further object of the present invention is to provide a method that can be easily computer-implemented without the adoption of expensive processing resources.

These aim and objects are achieved by a method to set-up the operating parameters of an electronic relay, according to the following claim 1 and the related dependent claims.

The method, according to the invention, concerns the configuration of an electronic relay, which is adapted to be operatively associated to a switching device designed to electrically connect or disconnect said first and second live electric circuits at a given coupling node.

Preferably, said first live electric circuit comprises a micro-grid including one or more electric loads and one or more electric power sources.

Preferably, said second live electric circuit comprises a utility electric power distribution grid (here "utility power grid").

The electronic relay is capable of controlling the associated switching device, in particular enabling a disconnection or re-connection manoeuvre of the live electric circuits by this latter.

According to the invention, said electronic relay is adapted to provide synchro-reclosing functionalities to enable a re-connection between said first and second live electric circuits following a disconnection between said first and second live electric circuits.

In a general definition, the method, according to the invention, comprises the following steps:
  providing a graphic user interface on a computer display, said graphic user interface including graphic resources activatable by a user;
  providing first graphic resources on said graphic user interface to assist a user in providing first configuration values to configure first operating parameters concerning the operation of at least one of said first and second live electric circuits, said first operating parameters being processed by said electronic relay to provide said synchro-reclosing functionalities;
  providing second graphic resources on said graphic user interface to assist a user in providing second configuration values to configure second operating parameters concerning first operating conditions requested to said first and second live electric circuits to enable a re-connection between said first and second live electric circuits following a preceding disconnection between said first and second live electric circuits, said second operating parameters being processed by said electronic relay to provide said synchro-reclosing functionalities;
  checking whether said electronic relay meets minimum operating requirements to operate;
  if said electronic relay meets said minimum operating requirements, transmitting configuration information including at least said first and second configuration values to said electronic relay.

Preferably, said first graphic resources comprise one or more first and second graphic objects to set-up said first operating parameters. Said first graphic objects are activatable to upload said second graphic objects on said graphic user interface. Said second graphic objects are configured to assist a user in providing said first configuration values to set-up said first operating parameters. Preferably, said second graphic resources comprise one or more third and fourth graphic objects to set-up said second operating parameters. Said third graphic objects are activatable to upload said fourth graphic objects on said graphic user interface. Said fourth graphic objects are configured to assist a user in providing said second configuration values to set-up said second operating parameters.

According to an embodiment of the invention, said method comprises the step of providing third graphic resources on said graphic user interface to assist a user in providing third configuration values to configure third operating parameters concerning second operating conditions requested to one or more electric power sources of at least one of said first and second live electric circuits to enable a re-connection between said first and second live electric circuits. Said third operating parameters are processed by said electronic relay to provide said synchro-reclosing functionalities. Preferably, said third configuration values are included in the configuration information transmitted to said electronic relay.

Preferably, said third graphic resources comprise one or more fifth and sixth graphic objects to set-up said third operating parameters. Said fifth graphic objects are activatable to upload said sixth graphic objects on said graphic user interface. Said sixth graphic objects are configured to assist a user in providing said third configuration values to set-up said third operating parameters.

According to an embodiment of the invention, said method comprises the step of providing fourth graphic resources on said graphic user interface to assist a user in providing fourth configuration values to configure fourth operating parameters concerning one or more inputs and/or outputs of said electronic relay.

Preferably, said fourth configuration values are included in the configuration information transmitted to said electronic relay.

Preferably, said fourth graphic resources comprise one or more seventh and eighth graphic objects to set-up said fourth operating parameters. Said seventh graphic objects are activatable to command the computerised device 50 to upload said eighth graphic objects on said graphic user interface.

Said eighth graphic objects are configured to assist a user in providing said fourth configuration values to set-up said fourth operating parameters.

According to an embodiment of the invention, said method comprises the step of providing fifth graphic resources on said graphic user interface to graphically visualize one or more configuration values provided in input by the user.

According to an embodiment, said step of transmitting said configuration information to said electronic relay comprises the following steps:
receiving coded information to enable transmission of said configuration information to said electronic relay;
checking said coded information;
transmitting said configuration information to said electronic relay if said coded information is correct.

Preferably, said configuration information is transmitted to said electronic relay via an Internet or LAN or WAN communication line.

In some further aspects, the present invention thus relates to a computer program, according to the following claim 13, and to a computerised device, according to the following claim 14.

In yet further aspects, the present invention thus relates to an electronic relay, according to the following claim 15, and to a switching device, according to the following claim 16.

Further characteristics and advantages of the present invention will emerge more clearly from the description of preferred, but not exclusive embodiments, of which non-limiting examples are shown in the attached drawings, in which.

With reference to the above-mentioned figures, the present invention refers to a method CFP for configuring an electronic relay 2 in an electric power distribution grid operating at low or medium voltage levels.

For the purposes of the present application, the term "low voltage" (LV) relates to operating voltages lower than 1 kV AC and 1.5 kV DC whereas the term "medium voltage" relates to operating voltages up to some tens of kV, e.g. up to 72 kV AC and 100 kV DC.

The electronic relay 2 is intended to be operatively associated with a corresponding switching device $S_1$ (e.g. a circuit breaker, disconnector, contactor, or the like).

The switching device $S_1$ is capable of electrically connecting or disconnecting a first live electric circuit 100 with or from a second live electric circuit 200 at a coupling node PoC (Point of Coupling).

The electric circuits 100, 200 are defined as "live electric circuits" since they are capable of providing electric power at the coupling node PoC. To this aim, both the electric circuits 100, 200 comprise suitable electric power sources.

Preferably, the first electric circuit 100 is micro-grid, which may be of known type.

As is known, in the field of electric power distribution networks, a "micro-grid" is commonly intended as an electric power distribution system arranged and confined in a limited zone.

In addition to a variety of electric loads $L_1, \ldots, L_N$, the micro-grid 100 comprises a number of electric power sources $G_1, \ldots, G_M$.

The electric loads $L_1, \ldots, L_N$ may be of any type and arranged according to the needs. In general, an electric load $L_1, \ldots, L_N$ may be any device adapted to consume an amount of electric power in operation.

Also the electric power sources $G_1, \ldots, G_M$ may be of any type and arranged according to the needs. As an example, they may comprise electric generators, solar panel plants, wind turbine plants, combined heat and power systems, marine energy generation systems, solar generation, diesel generation, geothermal or biomass energy generation systems, fuel cells, capacitor banks, batteries and the like.

Preferably, the second electric circuit is a utility power grid, which may be of known type.

Normally, the electric circuit 100 is electrically connected to the electric circuit 200.

However, in response to system needs, abnormal conditions (e.g. faults or power outages in the main grid) or user's decision, the electric circuit 100 may be electrically disconnected from the electric circuit 200 by the switching device $S_1$.

In this case, electric quantities of the live electric circuits 100, 200 at the terminals T1, T2 of the coupling node PoC may remarkably vary depending on the operation of the disconnected electric circuits.

As an example, when the second electric circuit 200 is a utility power grid and the first electric circuit 100 is a micro-grid operating in a so-called "islanded mode" (i.e. disconnected from the utility power grid 200), the operating frequency, phase and voltage of the first electric circuit 100 at the terminal T1 of the coupling node PoC may be subject to relevant transients or fluctuations with respect to the operating frequency, phase and voltage of the second electric circuit 200 at the terminal T2 of the coupling node PoC (in this case the electric quantities provided by the second electric circuit 200 are substantially stable as this latter is a utility power grid).

The electronic relay 2 is capable of providing synchro-reclosing functionalities, which consist in acquiring data related to the electric quantities provided by the first and second electric circuits 100, 200 at the coupling node PoC, processing said data and checking whether the electric circuits 100, 200 operate within a safe and stable compatibility area.

The electronic relay 2 enables the switching device $S_1$ to re-connect said electric circuits only if the carried out synchro-reclosing tasks confirm that the electric circuits 100, 200 operate within said compatibility area.

The above-mentioned synchro-reclosing functionalities may be of known type and will not here furthermore described for the sake of brevity. As an example, the synchro-reclosing functionalities provided by the electronic relay 2 may be similar to those provided by the above-mentioned relays commercially available in the market.

In general, the electronic relay 2 comprises one or more inputs, at which it can receive input signals (e.g. data signals or control signals) from one or more devices (e.g. sensors or other relays) operatively connected thereto, and one or more outputs, at which it can provide output signals (e.g. data signals or control signals) for one or more devices (e.g. the switching device 20) operatively connected thereto.

Figure 1:
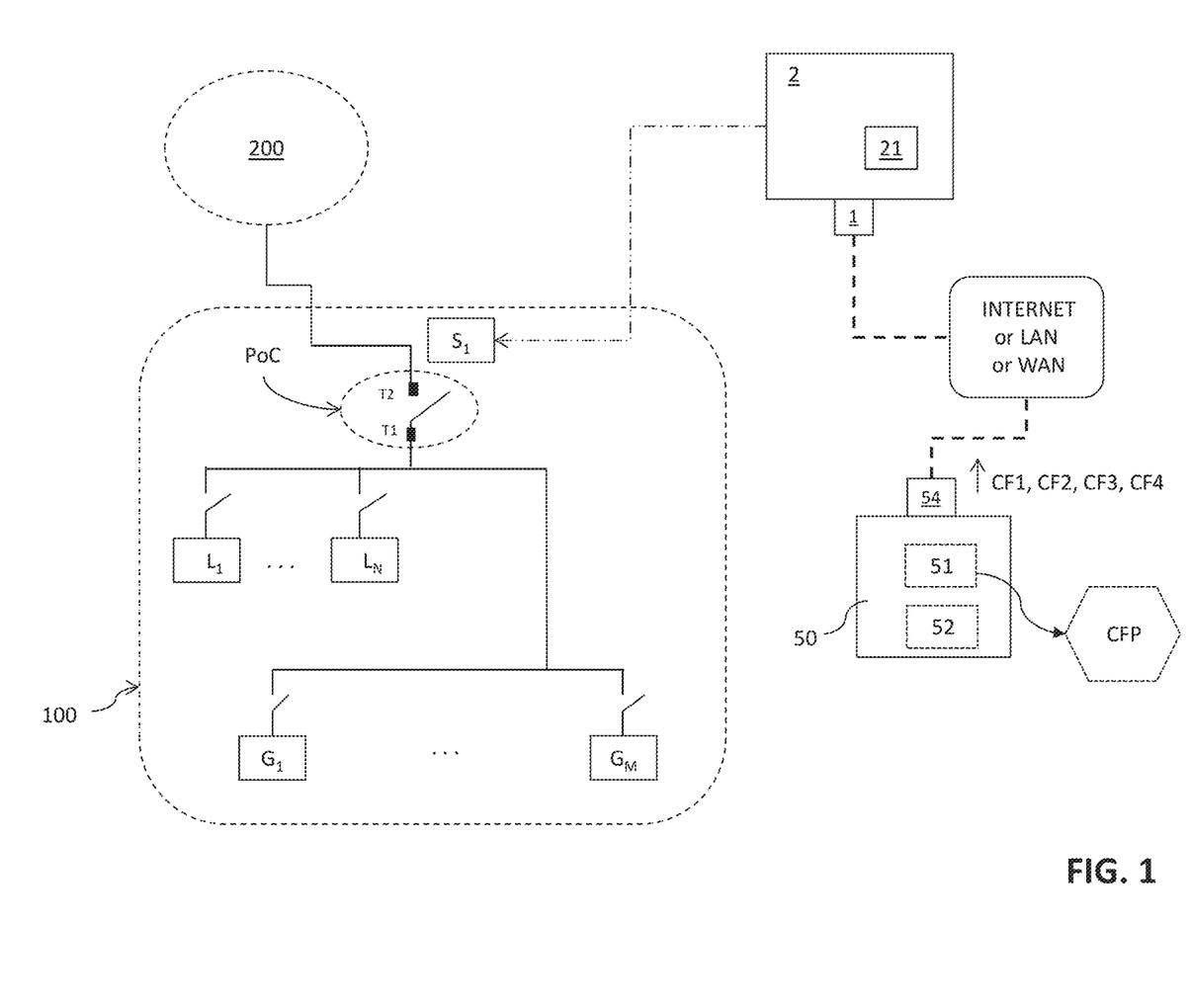
FIGS. 1-3 are schematic views showing first and second live electric circuits, a switching device to electrically connect or disconnect said live electric circuits, an electronic relay capable of providing synchro-reclosing functionalities operatively associated to said switching device and a computerised device implementing the method for configuring said electronic relay, according to the invention.
Figure 2:
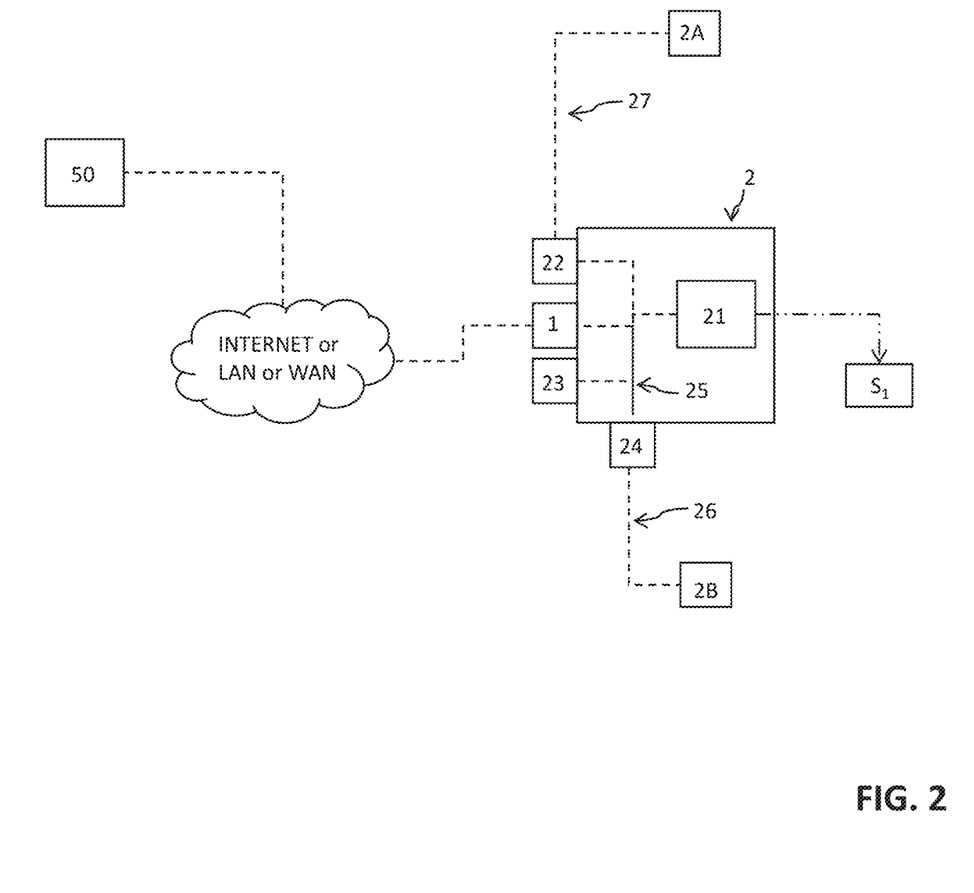

Referring to FIG. 1, the electronic relay 2 preferably comprises a control unit 21 configured to manage the operation of said electronic relay.

The control unit 21 is conveniently provided with processing resources (e.g. including one or more microprocessors) capable of executing software instructions stored or storable in a storage medium (e.g. a memory of said control unit).

The electronic relay 2 may comprise or be operatively coupled with various types of communication buses 25, 26, 27.

As an example, the electronic relay 2 may comprise a local bus 25 conveniently designed to provide a communication channel between the control unit 21 and other accessory devices 1, 22, 23, 24 of the electronic protection relay 2. The local bus 25 may implement a communication protocol of the FIELDBUS type, such as ETHERNET, with communication modalities of the "multi-master" type.

As a further example, the electronic relay 2 may be arranged to communicate with further several electronic protection devices 2A through a system bus 27 of the electric power distribution grid 250. The system bus 27 may be conveniently designed to provide a communication channel between the control unit 21 and further electronic devices 2A (e.g. further electronic relays) that may be also in a remote location with respect to the relay 2. The system bus 27 may implement a communication protocol of the MODBUS, PROFIBUS, PROFINET or MODBUS-TCP type, using communication modalities of the "master-slave" type.

As a further example, the electronic relay 2 may be arranged to communicate with further electronic devices 2B through a switchboard bus 26 of the switchgear including the relay itself. The switchboard bus 26 is conveniently designed to provide a dedicated communication channel between the protection and control unit 21 and further electronic devices 2B (e.g. further electronic relays) of said switchgear. The switchboard bus 26 may implement a communication protocol of the FIELDBUS type using communication modalities of the "multi-master" type.

The electronic relay 2 may comprise or be operatively coupled with various accessory devices designed to potentiate/expand the functionalities of the control unit 21 (as the accessory device 23), provide an interface towards external communication buses (as the accessory devices 22, 24) or a remote communication interface (as the accessory device 1) for the protection and control unit 21, and the like.

Figure 4:
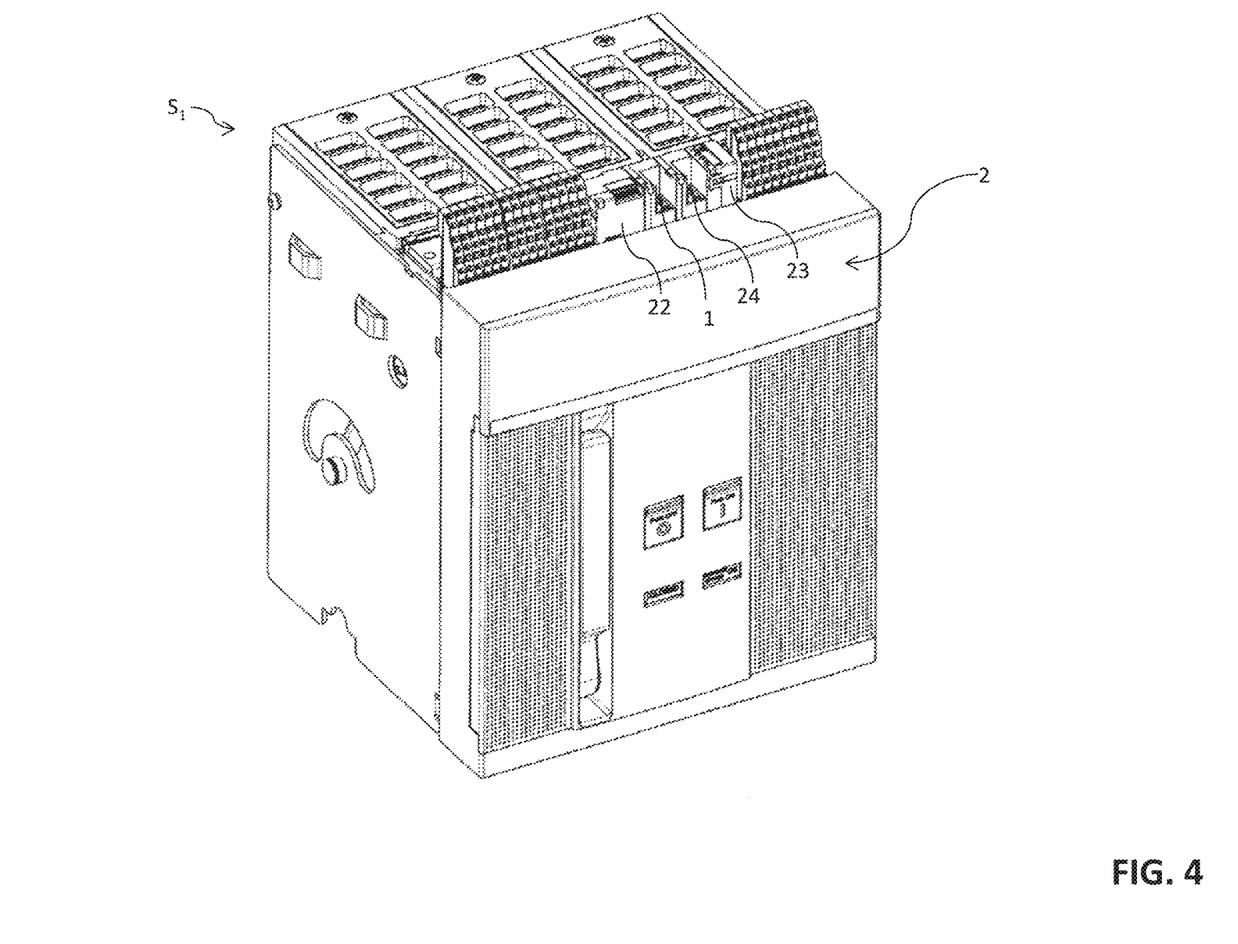
FIG. 4 schematically shows the switching device of FIGS. 1-3 in an embodiment.

Preferably, the accessory devices 1, 22, 23, 24 are adapted to be removably mounted together with the corresponding electronic protection relay 2 on the switching device 20, as shown in FIG. 4.

However, according to other solutions, the accessory devices 1, 22, 23, 24 may be removably mounted on the external case of the electronic protection relay 2, when this latter is a self-standing unit, or may form internal electronic modules integrated within the corresponding electronic relay 2.

According to some embodiments of the invention, the electronic relay 2 comprises or is operatively coupled with a dedicated accessory device 23 adapted to interact with the control unit 21 to provide the above-mentioned synchro-reclosing functionalities. In this case, both the accessory device 23 and the control unit 21 are conveniently provided with interacting processing resources capable of executing software instructions configured to provide the above-mentioned synchro-reclosing functionalities.

As an alternative, the control unit 21 may be provided with autonomous processing resources capable of executing software instructions configured to provide the above-mentioned synchro-reclosing functionalities.

Conveniently, the electronic relay 2 has remote communication capabilities for communication with one or more remote computerized devices through an Internet or LAN or WAN communication line.

To this aim, preferably, the electronic relay 2 is operatively coupled with or comprises an accessory device 1.

Figure 3:
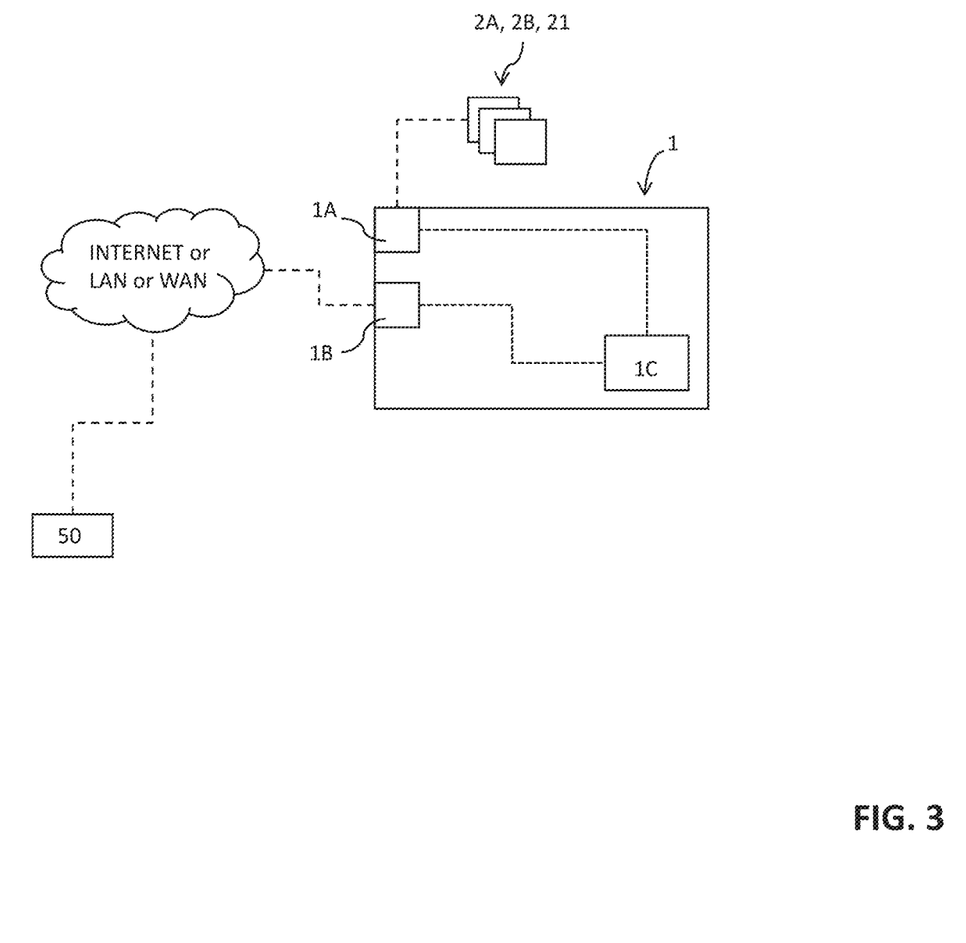

Referring to FIG. 3, the accessory device 1 preferably comprises at least a first communication port 1A suitable for communication with electronic devices (e.g. the control unit 21) included in or operatively connected with the corresponding electronic relay 2.

As an example, the communication port 1A may be an ETHERNET port suitable to be operatively coupled with the local bus 25 of the corresponding electronic relay 2.

Preferably, the accessory device 1 comprises at least a second communication port 1B suitable for communication with one or more remote computerized devices 50 through an Internet or LAN or WAN communication line.

As an example, the communication port 1B may be a TCP or UDP port suitable for an Internet protocol suite.

Information may be transmitted through an Internet or LAN or WAN communication line by means of a suitable communication cable (e.g. of the ETHERNET type) or a suitable antenna arrangement (e.g. of the Wi-Fi or Bluetooth type).

Preferably, the accessory device 1 comprises a corresponding processing unit 1C configured to manage the operation of said accessory device. The processing unit 1C is conveniently provided with processing resources (e.g. including one or more microprocessors) capable of executing software instructions stored or storable in a storage medium (e.g. a memory of said control unit).

It is important to notice that the accessory device 1 is capable of providing the corresponding electronic relay 2 with a direct connection to an Internet or LAN or WAN communication line without the need of using or arranging dedicated communication buses (such as e.g. the system bus 27).

In other words, the accessory device 1 is adapted to operate as an Internet or LAN or WAN gateway through which the electronic relay 2 (in particular the protection and control unit 21 thereof) can directly communicate with a remote computerised device (e.g. the computerised device 50).

Other solutions to provide the electronic relay 2 with remote communication capabilities are possible.

As an example, the electronic device 2 may comprise one or more communication ports of traditional type (e.g. TCP or UDP ports suitable for an Internet protocol suite) for communication with one or more remote computerized devices through an Internet or LAN or WAN communication line.

However, also in this case, information may be transmitted through a suitable communication cable (e.g. of the ETHERNET type) or a suitable antenna arrangement (e.g. of the Wi-Fi or Bluetooth type).

As mentioned above, the method CFP, according to the invention, is a method for configuring the electronic relay 2.

In the framework of the present invention, "configuring" the electronic relay 2 consists, in general, in setting-up suitable operating parameters processed by said electronic relay to implement its functionalities, in particular the above-mentioned synchro-reclosing functionalities.

In general, said operating parameters may be set-up by providing the electronic relay 2 with suitable numeric or logic values (configuration values) that can be stored and processed by the electronic relay itself.

As it will apparently emerge from the following, the method CFP, according to the invention, is particularly suitable for being implemented by a computerised device 50 and, for the sake of clarity, it will be described in the following with specific reference to this kind of implementation.

In general, the computerised device 50 may be of any known type, such a desktop computer, a laptop computer, a tablet, a smartphone or the like.

Referring to FIG. 1, the computerised device 50 is provided with processing resources 51 (e.g. including one or more microprocessors) configured to manage the operation of said computerised device. Said processing resources are capable of executing software instructions stored or storable in a storage medium (e.g. a memory of said computerised device) to implement the configuration method CFP, according to the invention.

The computerised device 50 comprises or it is operatively associated to a display 52 driven by the processing resources 51.

Conveniently, the computerised device 50 has Internet or LAN or WAN communication capabilities.

To this aim, it is preferably equipped with one or more communication ports 54 (e.g. ETHERNET or Bluetooth or Wi-Fi ports) for communication with remote electronic devices through the Internet or a LAN or a WAN. As an example, the communication ports 54 may be TCP or UDP ports suitable for an Internet protocol suite.

Information may be transmitted through a suitable communication cable (e.g. of the ETHERNET type) or a suitable antenna arrangement (e.g. of the Wi-Fi or Bluetooth type).

The computerised device 50 is thus conveniently capable of communicating with the electronic relay 2 via an Internet or LAN or WAN communication line.

The method CFP, according to the invention, for configuring the electronic relay 2 is now described in details.

Figure 5:
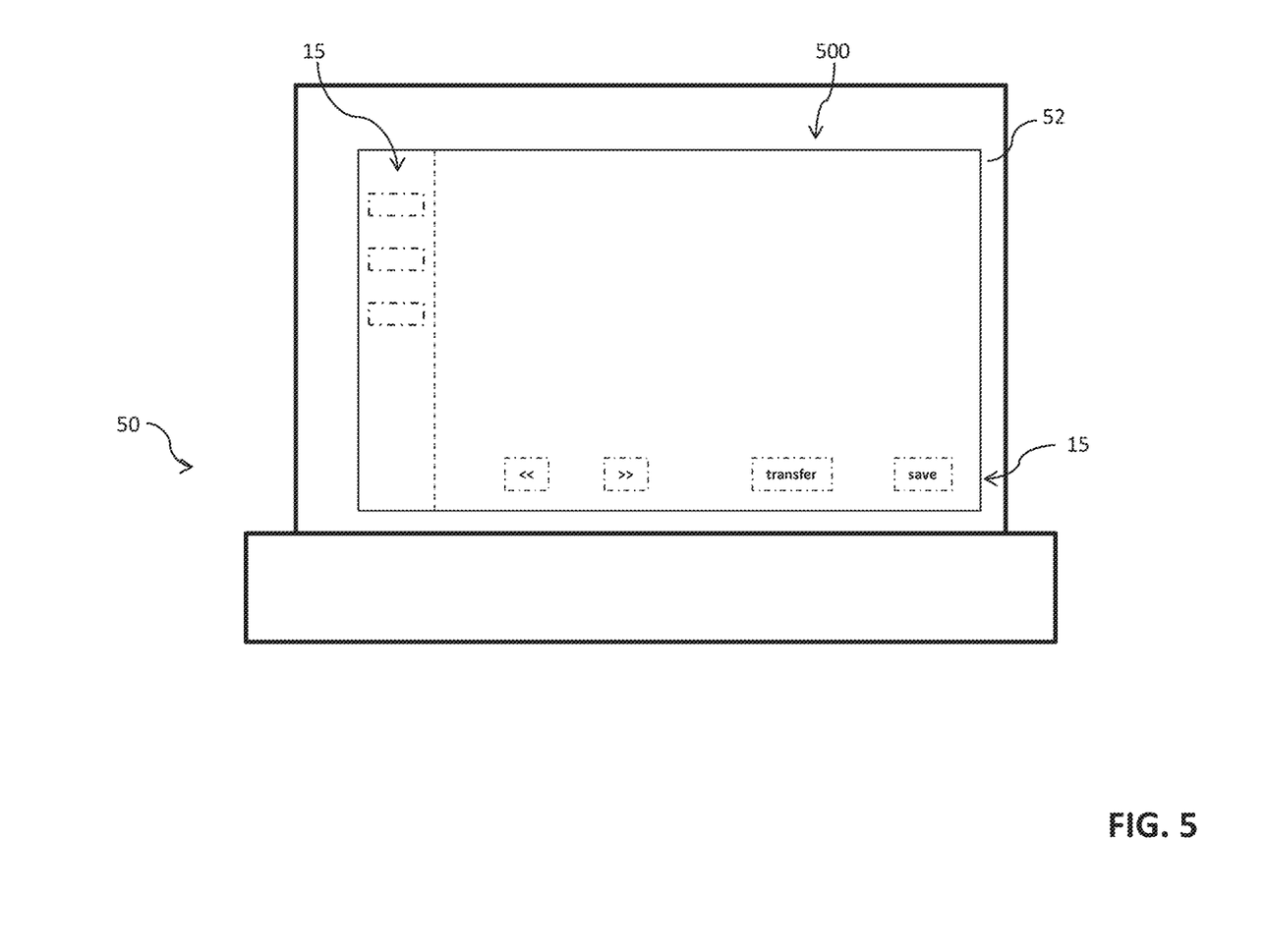
FIGS. 5-9 are schematic views showing the steps of the method, according to the invention.

According to the invention, the method CFP comprises a step in which the computerised device 50 provides a graphic user interface 500 on the computer display 52 (FIG. 5).

The graphic user interface (GUI) 500 is a visual graphic environment comprising visual graphic resources 11, 12, 13, 14, 15, 16 (e.g. graphic icons, graphic windows, graphic cursors, visual indicators, visual menus, and the like) to assist a user in configuring the electronic relay 2 by means of the computerised device 50.

In general, the graphic resources 11, 12, 13, 14, 15, 16 are made available to allow a user to provide in input to the computerised device 50 specific commands or configuration information to configure the electronic relay 2.

Conveniently, the graphic resources 11, 12, 13, 14, 15, 16 can be activated by a user in accordance to known activation modes adopted in computerised devices, e.g. clicking on said graphic resources through a mouse pointer (e.g. when the display 52 is a computer monitor or a lap-top display) or touching corresponding interactive regions of the display 52 (e.g. when the display 52 is a touch-screen display).

Configuration information can be provided in input to the computerised device 50 by a user in accordance to known input modes adopted in computerised devices, e.g. typing or activating dedicated graphic objects (graphic cursors, graphic icons, and the like).

Preferably, the GUI 500 comprises one or more configuration pages, at which the graphic resources 11, 12, 13, 14, 15, 16 are made available. Each configuration page may include one or more configuration sections where the above-mentioned graphic resources are displayed.

Preferably, the GUI 500 comprises auxiliary graphic resources 16 (e.g. graphic buttons) on each configuration page to allow a user to navigate through different configuration pages or to save or to upload said configuration pages on or from a storage memory of the computerised device 50.

According to the invention, the method CFP comprises a step of providing first graphic resources 11 on the GUI 500 to assist a user in providing first configuration values CF1 to configure first operating parameters related to the operation of at least one of the first and second live electric circuit 100, 200.

Preferably, when the first electric circuit 100 is a microgrid and the second electric circuit 200 is a utility power grid, said first operating parameters preferably include operating parameters concerning the operation of the first electric circuit 100, more particularly the operation of the electric power sources $G_1, \ldots, G_M$ included in the electric circuit 100.

As an example, said first operating parameters include the number of electric power generators arranged in parallel, the nominal voltage and nominal power values of said generators, operating values related to the physical structure of said micro-grid, and the like.

Of course, in other embodiments of the invention (not shown), said first operating parameters may include operating parameters of different type depending on the operation of the electric circuits 100 or 200, according to the needs.

Conveniently, the first operating parameters to be configured by the first configuration values CF1 are processed by the electronic relay 2 to provide the above-mentioned synchro-reclosing functionalities.

Preferably, the first graphic resources 11 comprise first and second graphic objects 111, 112 activatable by a user to set-up said first operating parameters.

Preferably, the first graphic objects 111 are automatically uploaded on the GUI 500 and are activatable to command the computerised device 50 to upload the second graphic objects 112 on the GUI 500.

Preferably, the second graphic objects 112 are automatically uploaded on the GUI 500 in response to the activation of the first graphic objects 111 and are configured to assist a user in providing the first configuration values CF1 to set-up said first operating parameters.

Conveniently, the first and second graphic objects 111, 112 include graphic buttons, graphic masks, graphic cursors and/or graphic menus that can be employed to provide the first configuration values CF1 in input to the computerised device 50 in order to set-up the above-mentioned first operating parameters.

Figure 6:
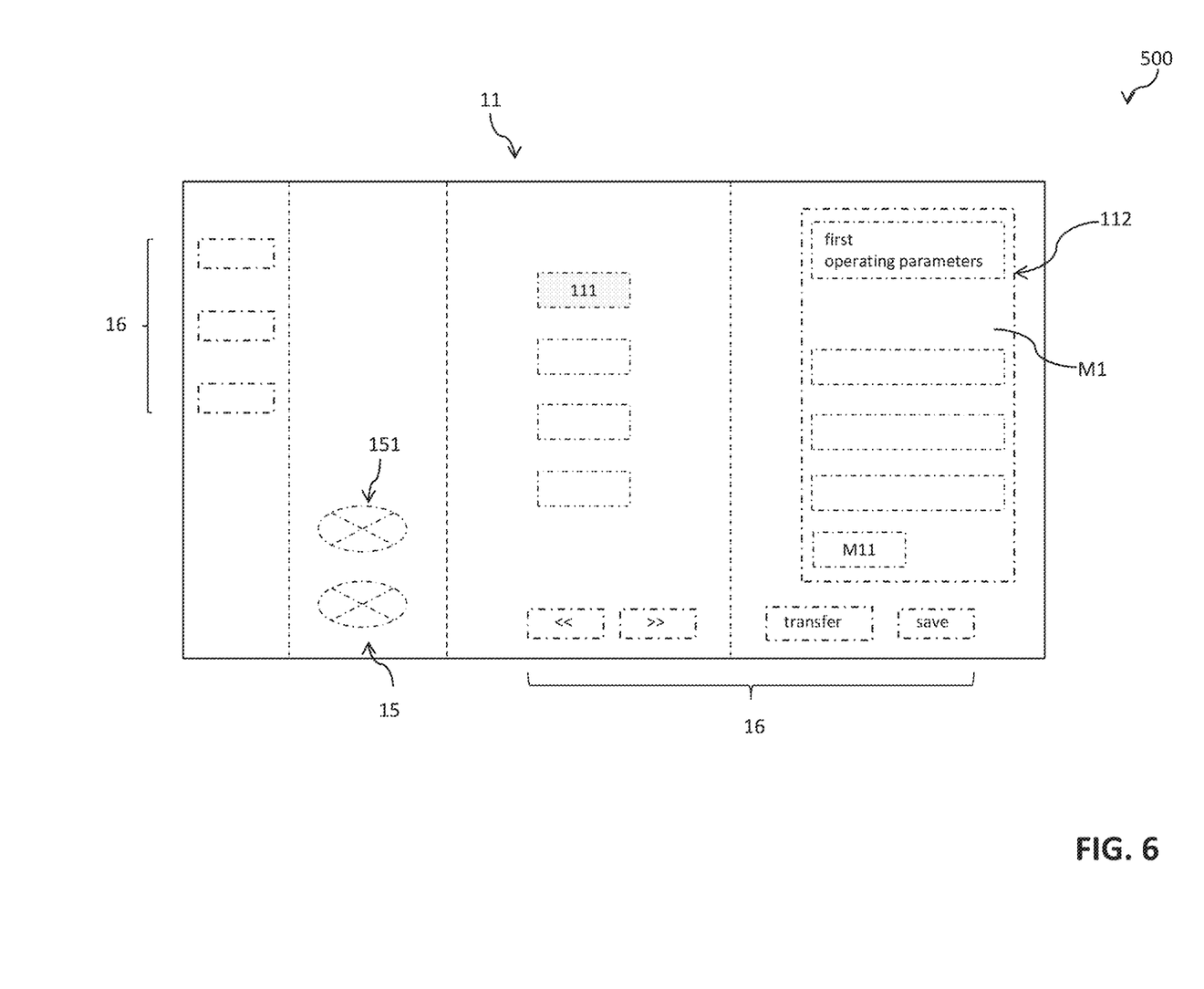

In the schematic example of FIG. 6, the first graphic objects 111 comprise a graphic icon that can be clicked on to upload a corresponding graphic menu M1 (second graphic objects 112) on the GUI 500. The configuration values CF1 to set-up the above-mentioned first operating parameters may be typed on typing sections of the graphic menu M1.

Conveniently, the graphic menu M1 may comprise one or more graphic icons M11 that can be clicked on to activate additional menu sections configured to allow a user to input the configuration values CF1.

According to the invention, the method CFP comprises a step of providing second graphic resources 12 on the GUI 500 to assist a user in providing second configuration values CF2 to configure second operating parameters related to first operating conditions requested to the first and second electric circuits 100, 200 to enable a re-connection between said electric circuits following a previous disconnection between said electric circuits.

Conveniently, said second operating parameters are processed by the electronic relay 2 to provide the above-mentioned synchro-reclosing functionalities.

Preferably, said second operating parameters include operating parameters related to the admitted maximum differences between one or more electric quantities at the terminals T1, T2 of the coupling node PoC (when the electric circuit 100, 200 are disconnected) to enable a re-connection between the first and second electric circuits 100, 200.

As an example, said second operating parameters may include values indicative of the admitted maximum differences between the operating frequency, phase and voltage of the first and second electric circuits 100, 200 at the terminals T1, T2 of the coupling node PoC to enable a re-connection between the first and second electric circuits 100, 200.

Conveniently, said second operating parameters may include additional operating parameters related to the operation of the first and second electric circuits 100, 200 according to the needs.

Preferably, the second graphic resources 12 comprise third and fourth graphic objects 121, 122 activatable by a user to set-up said second operating parameters.

Preferably, the third graphic objects 121 are automatically uploaded on the GUI 500 and are activatable to command the computerised device 50 to upload the fourth graphic objects 122 on the GUI 500.

Preferably, the fourth graphic objects 122 are automatically uploaded on the GUI 500 in response to the activation of the third graphic objects 121 and are configured to assist a user in providing the second configuration values CF2 to set-up said second operating parameters.

Conveniently, the third and fourth graphic objects 121, 122 include graphic buttons, graphic masks, graphic cursors and/or graphic menus that can be employed to provide the second configuration values CF2 in input to the computerised device 50 in order to set-up the above-mentioned second operating parameters.

Figure 7:
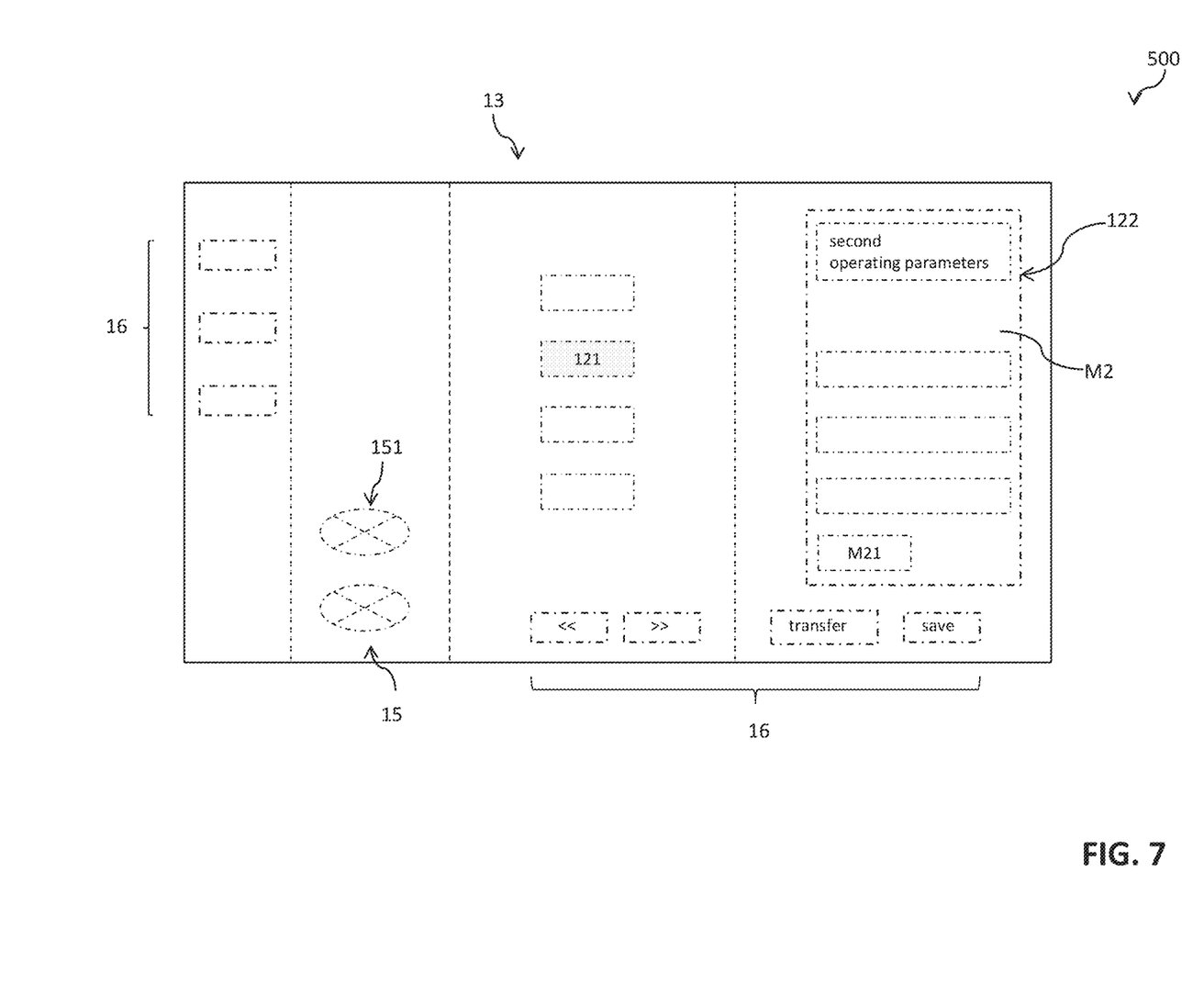

In the schematic example of FIG. 7, the third graphic objects 121 comprise a graphic icon that can be clicked on to upload a corresponding graphic menu M2 (fourth graphic objects 122) on the GUI 500. The configuration values CF2 to set-up the above-mentioned second operating parameters may be typed on typing sections of the graphic menu M2.

Conveniently, the graphic menu M1 may comprise one or more graphic icons M21 that can be clicked on to activate additional menu sections configured to allow a user to input the second configuration values CF2.

According to a preferred embodiment of the invention, the method CFP comprises a step of providing third graphic resources 13 on the GUI 500 to assist a user in providing third configuration values CF3 to configure third operating parameters related to second operating conditions requested to the electric power sources $G_1, \ldots, G_M$ of at least one of the first and second electric circuits 100, 200 to enable a re-connection between the electric circuits 100, 200.

Preferably, when the first electric circuit 100 is a micro-grid and the second electric circuit 200 is a utility power grid, said third operating parameters include operating parameters related to the minimum stability intervals (e.g. in terms of voltage and frequency) required to the electric power sources $G_1, \ldots, G_M$ of the electric circuit 100 to enable a re-connection with the electric circuit 200. Of course, in other embodiments of the invention (not shown), said third operating parameters may include operating parameters of different type depending on the operation of the electric circuits 100 or 200, according to the needs.

Conveniently, the third operating parameters to be configured by the configuration values CF3 are processed by the electronic relay 2 to provide the above-mentioned synchro-reclosing functionalities.

Preferably, the third graphic resources 13 comprise fifth and sixth graphic objects 131, 132 activatable by a user to set-up said second operating parameters.

Preferably, the fifth graphic objects 131 are automatically uploaded on the GUI 500 and are activatable to command the computerised device 50 to upload the sixth graphic objects 132 on the GUI 500.

Preferably, the sixth graphic objects 132 are automatically uploaded on the GUI 500 in response to the activation of the fifth graphic objects 131 and are configured to assist a user in providing the third configuration values CF3 to set-up said third operating parameters.

Conveniently, the fifth and sixth graphic objects 131, 132 include graphic buttons, graphic masks, graphic cursors and/or graphic menus that can be employed to provide the third configuration values CF3 in input to the computerised device 50 in order to set-up the above-mentioned third operating parameters.

Figure 8:
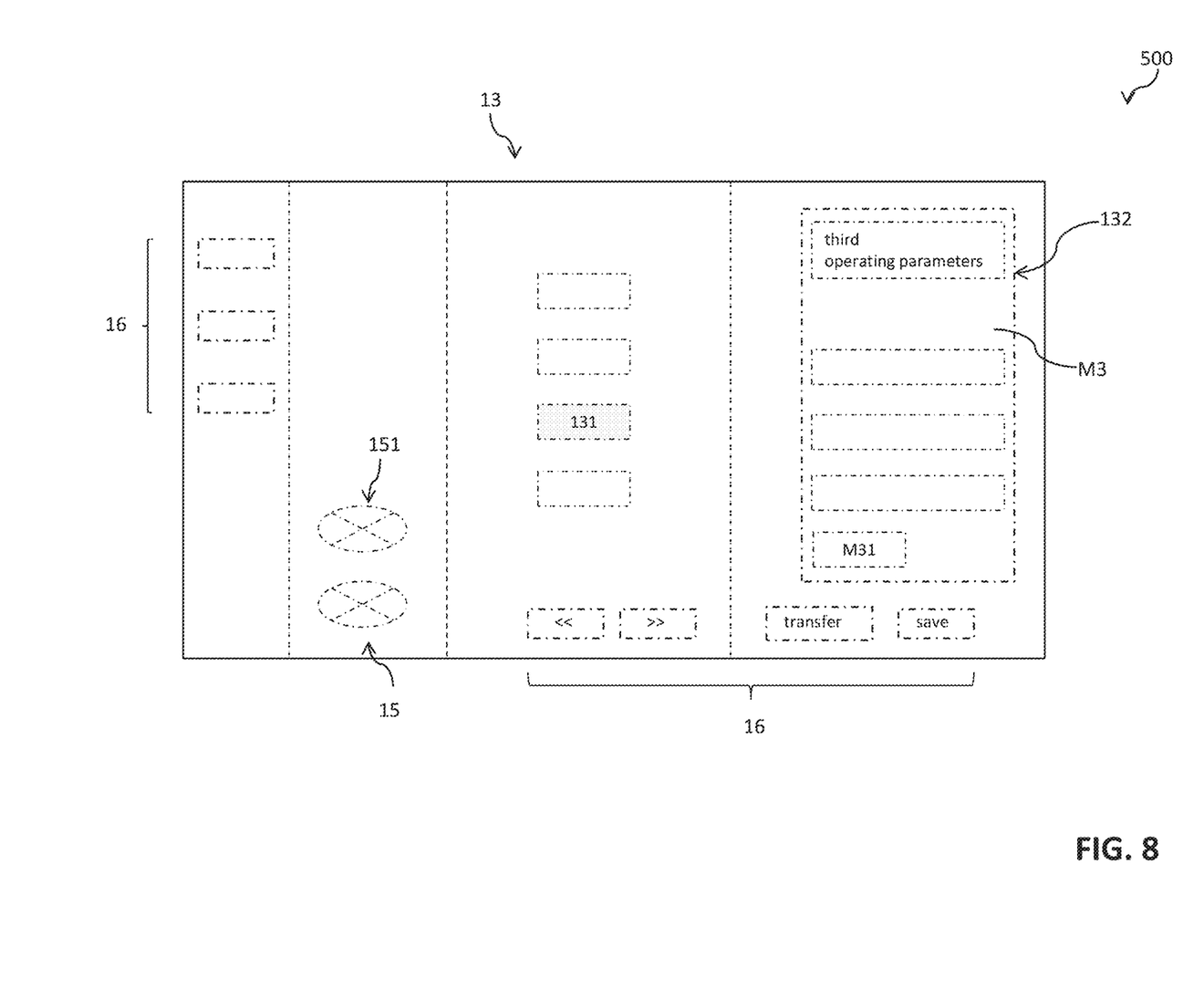

In the schematic example of FIG. 8, the fifth graphic objects 131 comprise a graphic icon that can be clicked on to upload a corresponding graphic menu M3 (sixth graphic objects 132) on the GUI 500. The configuration values CF3 to set-up the above-mentioned third operating parameters may be typed on typing sections of the graphic menu M3.

Conveniently, the graphic menu M3 may comprise one or more graphic icons M31 that can be clicked on to activate additional menu sections configured to allow a user to input the third configuration values CF3.

According to a preferred embodiment of the invention, the method CFP comprises a step of providing fourth graphic resources 14 on the GUI 500 to assist a user in providing in providing fourth configuration values CF4 to configure fourth operating parameters to manage one or more inputs and/or outputs of the electronic relay 2.

As an example, said fourth operating parameters may comprise set-up values to manage communication tasks of the electronic relay 2 with external devices, e.g. with the electric power sources $G_1, \ldots, G_M$.

Preferably, the fourth graphic resources 14 comprise seventh and eighth graphic objects 141, 142 activatable by a user to set-up said third operating parameters.

Preferably, the seventh graphic objects 141 are automatically uploaded on the GUI 500 and are activatable to command the computerised device 50 to upload the eighth graphic objects 142 on the GUI 500.

Preferably, the eighth graphic objects 142 are automatically uploaded on the GUI 500 in response to the activation of the seventh graphic objects 141 and are configured to assist a user in providing the fourth configuration values CF4 to set-up said fourth operating parameters.

Conveniently, the seventh and eighth graphic objects 141, 142 include graphic buttons, graphic masks, graphic cursors and/or graphic menus that can be employed to provide the fourth configuration values CF4 in input to the computerised device 50 in order to set-up the above-mentioned fourth operating parameters.

Figure 9:
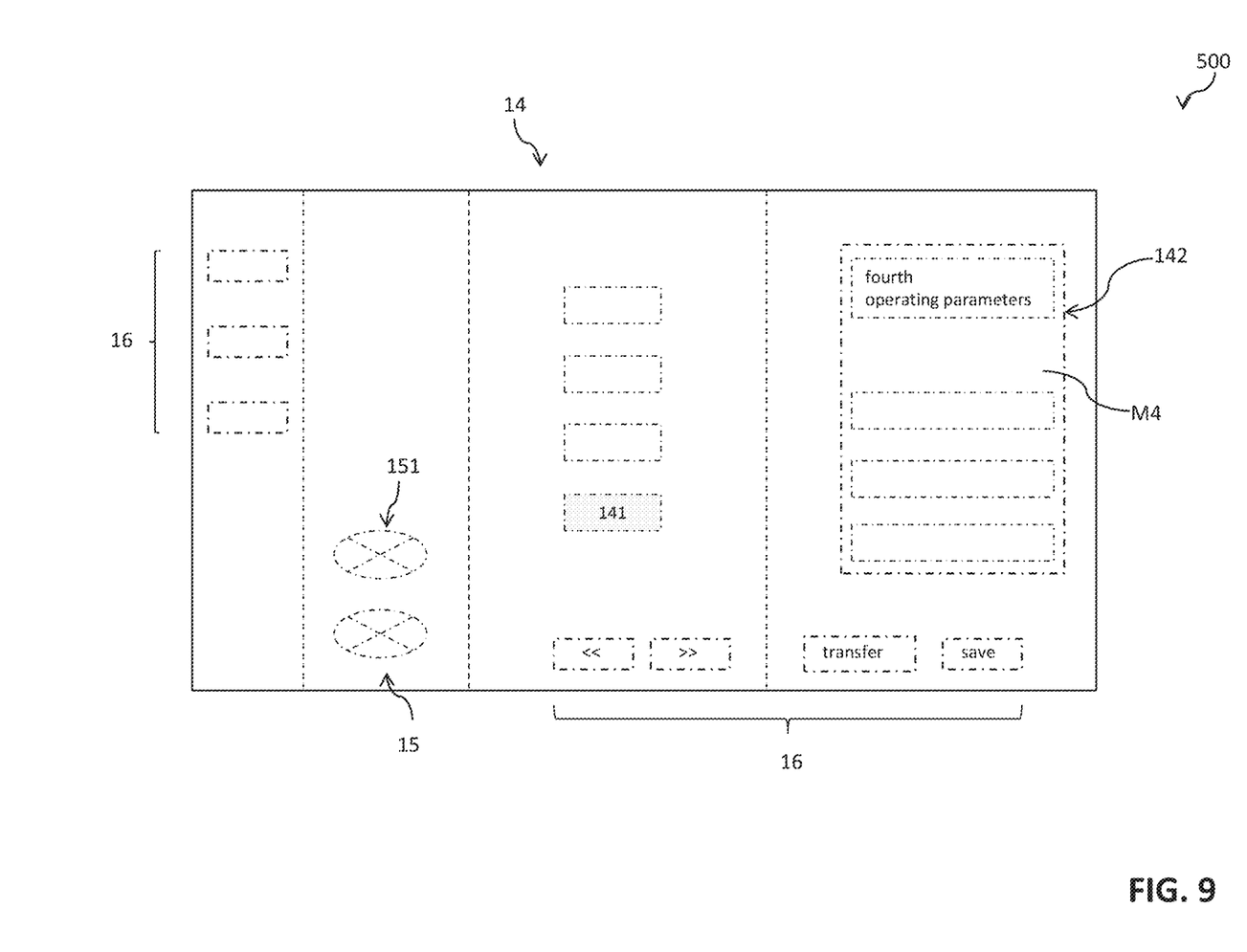

In the schematic example of FIG. 9, the seventh graphic objects 141 comprise a graphic icon that can be clicked on to upload a corresponding graphic menu M4 (seventh graphic objects 142) on the GUI 500. The configuration values CF4 to set-up the above-mentioned fourth operating parameters may be selected through suitable selection windows of the graphic menu M4.

According to a preferred embodiment of the invention, the method CFP comprises a step of providing fifth graphic resources 15 on the GUI 500 to graphically visualize one or more configuration values (preferably the configuration values CF2) provided in input to the computerised unit 50 by the user.

Preferably, the fifth graphic resources 15 comprise ninth graphic objects 151 automatically uploaded on the GUI 500.

Conveniently, the ninth graphic objects 151 include graphic masks or graphic cursors providing a quantitative graphic representation of the configuration values provided in input by the user.

Preferably, a user can save the configuration values CF1, CF2, CF3, CF4 provided in input through the GUI 500 on a storage memory of the computerised device 50 by activating a suitable auxiliary graphic resource 16 (e.g. a saving button "save").

At this stage of the method, configuration information including at least the first and second configuration values CF1, CF2 and, preferably, also the configuration values CF3, CF4, can be transmitted to the electronic relay by the computerised device 50.

However, according to the invention, before transmitting said configuration information to the electronic relay 2, the method CFP comprises a step, in which the computerised device 50 checks whether minimum operating requirements are met by the electronic relay 2.

This step is quite advantageous as it ensures a correct transmission of the configuration information to the electronic relay 2 and, consequently, the prompt operability of the said relay once it has been duly configured.

Preferably, said checking step is automatically carried out, at least partially, by the computerised device 50 upon establishing a communication with the electronic relay 2 and interrogating this latter.

If the above-mentioned checking step has not successfully completed, an alarm message is provided by the computerised device 50 on the GUI 500.

If the above-mentioned checking step has successfully completed, configuration information can be transmitted to the electronic relay 2 by activating a suitable auxiliary graphic resource 16 (e.g. a downloading button "transfer") enabled at the end of said checking step.

Accordingly, the method CFP comprises a step, in which the computerised device 50 transmits the above-mentioned configuration information to the electronic relay 2.

Upon receiving said configuration information, the electronic relay 2 can properly set its operating parameters and start operating.

Preferably, said configuration information is transmitted by the computerised device 50 to the electronic relay 2 via an Internet or a LAN or a WAN communication line.

Preferably, the transmission of said configuration information to the electronic relay 2 occurs upon the execution of an authentication procedure.

Preferably, such authentication procedure comprises a step, in which the computerised device 50 receives coded information to enable transmission of the above-mentioned configuration information to the electronic relay 2.

Such coded information may be received from a memory support (e.g. a USB storage device) operatively coupled to an input port (not shown) of the computerised device 50.

As an alternative, such coded information may be received from a remote computer source in communication with the computerised device 50 via the Internet or a LAN or a WAN.

Other solutions are however possible, according to the needs.

Preferably, such authentication procedure comprises a step, in which the computerised device 50 checks said coded information to control whether it is correct.

Preferably, such authentication procedure comprises a step, in which the computerised device 50 transmits said configuration information to the electronic relay 2, if said coded information is correct.

The method CFP, according to the invention, allows fully satisfying the above-mentioned aim and objects.

The method allows a user to carry out the configuration process of the electronic relay 2 in an assisted manner with simple steps that can be carried out also by personnel having small experience in modelling electric power distribution networks.

The electronic relay 2 can thus be configured in a quick and efficient manner with a limited probability of errors.

The method is particularly suitable for implementation by a computerised device capable of communicating with the electronic relay 2 through the Internet or a LAN or a WAN communication line. This allows avoiding or reducing the need for cabling activities during the configuration process.

The invention claimed is:

1. A method (CFP) for configuring an electronic relay for an electric power distribution network, said electronic relay being in operation operatively associated to a switching device ($S_1$) adapted to electrically connect or disconnect a first live electric circuit with or from a second live electric circuit at a coupling node (PoC), said electronic relay being capable of providing synchro-reclosing functionalities to enable a re-connection between said first and second live electric circuits following a disconnection between said first and second live electric circuits, the method comprises the following steps:
- providing a graphic user interface on a computer display, said graphic user interface including graphic resources activatable by a user;
- providing first graphic resources on said graphic user interface to assist a user in providing first configuration values (CF1) to configure first operating parameters related to operation of at least one of said first and second live electric circuits, said first operating parameters being processed by said electronic relay to provide said synchro-reclosing functionalities;
- providing second graphic resources on said graphic user interface to assist a user in providing second configuration values (CF2) to configure second operating parameters related to first operating conditions requested to said first and second live electric circuits to enable a re-connection between said first and second live electric circuits following a disconnection between said first and second live electric circuits, said second operating parameters being processed by said electronic relay to provide said synchro-reclosing functionalities;
- checking whether said electronic relay meets minimum operating requirements to operate;
- if said electronic relay meets said minimum operating requirements, transmitting configuration information including at least said first and second configuration values (CF1, CF2) to said electronic relay.

2. The method, according to claim 1, which further comprises the step of providing third graphic resources on said graphic user interface to assist a user in providing third configuration values (CF3) to configure third operating parameters related to second operating conditions requested to one or more electric power sources ($G_1, \ldots, G_M$) of at least one of said first and second live electric circuits to enable a re-connection between said first and second live electric circuits, said third operating parameters being processed by said electronic relay to provide said synchro-reclosing functionalities.

3. The method, according to claim 1, which further comprises the step of providing fourth graphic resources on said graphic user interface to assist a user in providing fourth configuration values (CF4) to configure fourth operating parameters related to one or more inputs and/or outputs of said electronic relay, said fourth configuration values (CF4) being included in the configuration information transmitted to said electronic relay.

4. The method, according to claim 1, wherein said first graphic resources comprise one or more first and second graphic objects to set-up said first operating parameters, said first graphic objects being activatable to upload said second graphic objects on said graphic user interface, said second graphic objects being configured to assist a user in providing said first configuration values (CF1) to set-up said first operating parameters.

5. The method, according to claim 1, wherein said second graphic resources comprise one or more third and fourth graphic objects to set-up said second operating parameters, said third graphic objects being activatable to upload said fourth graphic objects on said graphic user interface, said fourth graphic objects being configured to assist a user in providing said second configuration values (CF2) to set-up said second operating parameters.

6. The method, according to claim 2, wherein said third graphic resources comprise one or more fifth and sixth graphic objects to set-up said third operating parameters, said fifth graphic objects being activatable to upload said sixth graphic objects on said graphic user interface, said sixth graphic objects being configured to assist a user in providing said third configuration values (CF3) to set-up said third operating parameters.

7. The method, according to claim 3, wherein said fourth graphic resources comprise one or more seventh and eighth graphic objects to set-up said fourth operating parameters, said seventh graphic objects being activatable to upload said eighth graphic objects on said graphic user interface, said eighth graphic objects being configured to assist a user in providing said fourth configuration values (CF4) to set-up said fourth operating parameters.

8. The method, according to claim 1, which further comprises the step of providing fifth graphic resources on said graphic user interface to graphically visualize one or more configuration values (CF2) provided in input by the user.

9. The method, according to claim 1, wherein said step of transmitting said configuration information to said electronic relay comprises the following steps:
- receiving coded information to enable transmission of said configuration information to said electronic relay;
- checking said coded information;
- transmitting said configuration information to said electronic relay if said coded information is correct.

10. The method, according to claim 1, wherein said configuration information is transmitted to said electronic relay via an Internet or LAN or WAN communication line.

11. The method, according to claim 1, wherein said first live electric circuit is a micro-grid comprising one or more electric loads ($L_1, \ldots, L_N$) and one or more electric power sources ($G_1, \ldots, G_M$).

12. The method, according to claim 1, wherein said second live electric circuit is a utility power grid.

13. A computer storage medium comprising:
- a set of instructions structured to be executed by a processing resource effective to:
  - operate an electronic relay and a switching device, the switching device being structured to selectively connect a first live electric circuit and a second live electric circuit,
  - provide a graphic user interface on a computer display, said graphic user interface including graphic resources activatable by a user,
  - provide first graphic resources on said graphic user interface to assist a user in providing first configuration values (CF1) to configure first operating parameters related to operation of at least one of said first and second live electric circuits, said first operating parameters being processed by said electronic relay to provide said synchro-reclosing functionalities, provide second graphic resources on said graphic user interface to assist a user in providing second configuration values (CF2) to configure second operating parameters related to first operating conditions requested to said first and second live electric circuits to enable a re-connection between said first and second live electric circuits following a disconnection between said first and second live electric circuits, said second operating parameters being processed by said electronic relay to provide said synchro-reclosing functionalities, check whether said electronic relay meets minimum operating requirements to operate, and if said electronic relay meets said minimum operating requirements, transmit configuration information including at least said first and second configuration values (CF1 and CF2) to said electronic relay.

14. A computerised device for controlling an electric power distribution network including an electronic relay, a switching device, a first live electric circuit, and a second live electric circuit, the switching device being structured to selectively connect a first live electric circuit and a second live electric circuit, the computerised device comprising:

a processing resource; and a memory device including instructions configured to be executable by the processing resource effective to:

provide a graphic user interface on a computer display, said graphic user interface including graphic resources activatable by a user, provide first graphic resources on said graphic user interface to assist a user in providing first configuration values (CF1) to configure first operating parameters related to operation of at least one of said first and second live electric circuits, said first operating parameters being processed by said electronic relay to provide said synchro-reclosing functionalities, provide second graphic resources on said graphic user interface to assist a user in providing second configuration values (CF2) to configure second operating parameters related to first operating conditions requested to said first and second live electric circuits to enable a re-connection between said first and second live electric circuits following a disconnection between said first and second live electric circuits, said second operating parameters being processed by said electronic relay to provide said synchro-reclosing functionalities, check whether said electronic relay meets minimum operating requirements to operate, and if said electronic relay meets said minimum operating requirements, transmit configuration information including at least said first and second configuration values (CF1 and CF2) to said electronic relay.

15. An electric power distribution network comprising:
an electronic relay;
a first live electric circuit;
a second live electric circuit;
a switching device structured to selectively connect a first live electric circuit and a second live electric circuit; and
a computerised device structured to:

provide a graphic user interface on a computer display, said graphic user interface including graphic resources activatable by a user, provide first graphic resources on said graphic user interface to assist a user in providing first configuration values (CF1) to configure first operating parameters related to operation of at least one of said first and second live electric circuits, said first operating parameters being processed by said electronic relay to provide said synchro-reclosing functionalities, provide second graphic resources on said graphic user interface to assist a user in providing second configuration values (CF2) to configure second operating parameters related to first operating conditions requested to said first and second live electric circuits to enable a re-connection between said first and second live electric circuits following a disconnection between said first and second live electric circuits, said second operating parameters being processed by said electronic relay to provide said synchro-reclosing functionalities, check whether said electronic relay meets minimum operating requirements to operate, and if said electronic relay meets said minimum operating requirements, transmit configuration information including at least said first and second configuration values (CF1 and CF2) to said electronic relay.

16. The electric power distribution network of claim 15 wherein the electronic relay is incorporated into the switching device.

17. The method, according to claim 2, which further comprises the step of providing fourth graphic resources on said graphic user interface to assist a user in providing fourth configuration values (CF4) to configure fourth operating parameters related to one or more inputs and/or outputs of said electronic relay, said fourth configuration values (CF4) being included in the configuration information transmitted to said electronic relay.

18. The method, according to claim 2, wherein said first graphic resources comprise one or more first and second graphic objects to set-up said first operating parameters, said first graphic objects being activatable to upload said second graphic objects on said graphic user interface, said second graphic objects being configured to assist a user in providing said first configuration values (CF1) to set-up said first operating parameters.

19. The method, according to claim 3, wherein said first graphic resources comprise one or more first and second graphic objects to set-up said first operating parameters, said first graphic objects being activatable to upload said second graphic objects on said graphic user interface, said second graphic objects being configured to assist a user in providing said first configuration values (CF1) to set-up said first operating parameters.

20. The method, according to claim 2, wherein said second graphic resources comprise one or more third and fourth graphic objects to set-up said second operating parameters, said third graphic objects being activatable to upload said fourth graphic objects on said graphic user interface, said fourth graphic objects being configured to assist a user in providing said second configuration values (CF2) to set-up said second operating parameters.

* * * * *